United States Patent
Chen et al.

(10) Patent No.: US 11,348,221 B2
(45) Date of Patent: May 31, 2022

(54) WAFER TESTING METHOD

(71) Applicant: MPI Corporation, Hsinchu County (TW)

(72) Inventors: Chien-Yu Chen, Hsinchu County (TW); Han-Yu Chuang, Hsinchu County (TW); Po-Han Peng, Hsinchu County (TW)

(73) Assignee: MPI CORPORATION, Chu-Pei (TW)

( * ) Notice: Subject to any disclaimer, the term of this patent is extended or adjusted under 35 U.S.C. 154(b) by 0 days.

(21) Appl. No.: 17/079,030

(22) Filed: Oct. 23, 2020

(65) Prior Publication Data

US 2021/0133948 A1 May 6, 2021

Related U.S. Application Data

(60) Provisional application No. 62/930,319, filed on Nov. 4, 2019.

(30) Foreign Application Priority Data

Sep. 3, 2020 (TW) ................................ 109130293

(51) Int. Cl.
*G01N 21/95* (2006.01)
*G06T 7/00* (2017.01)

(52) U.S. Cl.
CPC ........ *G06T 7/0004* (2013.01); *G01N 21/9501* (2013.01); *G06T 2207/30148* (2013.01)

(58) Field of Classification Search
CPC ............. G01N 21/9501; G06T 7/0004; G06T 2207/30148; H01L 22/12; H01L 22/20
See application file for complete search history.

(56) References Cited

U.S. PATENT DOCUMENTS

2005/0045821 A1* 3/2005 Noji ..................... G01N 23/225
250/311
2007/0118300 A1* 5/2007 Mollenkopf ...... H01L 21/67265
702/33

(Continued)

FOREIGN PATENT DOCUMENTS

WO    WO-0240980 A1 *  5/2002 ............ H01J 37/222
WO    WO-2014035348 A1 *  3/2014 .......... B25J 15/0658

OTHER PUBLICATIONS ip.com Search History (Year: 2022).*

*Primary Examiner* — Roy M Punnoose
(74) *Attorney, Agent, or Firm* — Birch, Stewart, Kolasch & Birch, LLP

(57) ABSTRACT

A wafer testing method adapted to test a thin wafer. The thin wafer is combined with a vacuum-release substrate to form a wafer-assembly, and the wafer-assembly is placed in a wafer cassette. The vacuum-release substrate is attached to a front surface of the wafer with an attaching force which is sensitive to air pressure. The method includes the following steps. First, taking out the wafer-assembly from the wafer cassette, then transferring the wafer-assembly to a warpage-detection-device and placing the wafer-assembly on a first stage of the warpage-detection-device. Then, detecting warpage of the wafer. If the warpage of the wafer is less than a warpage threshold, the wafer-assembly is taken out from the first stage, and the wafer-assembly is turned over to place the wafer-assembly on a second stage. Then, applying negative pressure to the vacuum-release substrate to eliminate the attaching force. Then, removing the vacuum-release substrate.

10 Claims, 6 Drawing Sheets

(56) References Cited

U.S. PATENT DOCUMENTS

| | | | |
|---|---|---|---|
| 2009/0061739 A1* | 3/2009 | Jeong | B24B 37/345 451/103 |
| 2015/0214085 A1* | 7/2015 | Jin | B25J 15/0658 294/185 |
| 2021/0098401 A1* | 4/2021 | Zhang | H01L 24/742 |

* cited by examiner

WAFER TESTING METHOD

CROSS-REFERENCES TO RELATED APPLICATIONS

This application claims the benefit of U.S. provisional application Ser. No. 62/930,319, filed on Nov. 4, 2019 and claims the priority of Patent Application No. 109130293 filed in Taiwan, R.O.C. on Sep. 3, 2020. The entirety of the above-mentioned patent applications are hereby incorporated by references herein and made a part of the specification.

BACKGROUND

Technical Field

The present invention relates to a wafer testing method, and in particular, to a wafer testing method applied to a thin wafer.

Related Art

After a surface of a wafer undergoes a plurality of processes, in addition to undergoing a plurality of heat treatments, the surface is covered with a plurality of coatings, traces, and elements. Because thermal expansion rates of the wafer, the coatings, the traces, and the elements are different, the surface of the wafer bears a certain degree of shrinkage stress and/or tensile stress, resulting in a certain degree of warping in the wafer. This kind of warpage is more pronounced as a thickness of the wafer becomes thinner, and serious warpage "potato chip" may occur in a severe case.

In practice, grinding the wafer to such a thin thickness is mostly in response to the trend of lighter, thinner, and smaller mobile electronic devices. Especially, various chips applied to smart phones including a vertical cavity surface emitting laser (VCSEL) for face recognition, a photosensitive element behind a camera lens, and even a system chip related to operation performance of a mobile phone need to be as thin as possible to meet a thickness specification of a subsequent assembled product.

A "thin wafer" mentioned in this specification is generally a wafer with a thickness of less than 200 microns, and warpage of a wafer below this thickness is very obvious, making a subsequent detection procedure very difficult.

SUMMARY

The present invention provides a wafer testing method adapted to test a wafer. The wafer is disposed on a vacuum-release substrate and is combined with the vacuum-release substrate to form a wafer assembly. The vacuum-release substrate has an attaching surface and a non-attaching surface opposite to the attaching surface, the attaching surface of the vacuum-release substrate is attached to a front surface of the wafer with an attaching force, and the attaching force is sensitive to an air pressure. The wafer assembly is placed in a wafer cassette in a default state. The wafer testing method includes: taking out the wafer assembly from the wafer cassette through a robotic arm; transferring the wafer assembly to a warpage detection device through the robotic arm, and placing the wafer assembly on a first stage of the warpage detection device; detecting whether warpage of the wafer is less than a warpage threshold by using the warpage detection device; if the warpage of the wafer is less than the warpage threshold, taking out the wafer assembly from the first stage through the robotic arm; turning over the wafer assembly through the robotic arm, and placing the wafer assembly on a second stage; providing a negative pressure to the wafer assembly to eliminate the attaching force between the vacuum-release substrate and the wafer; taking out the vacuum-release substrate from the second stage through the robotic arm to expose the front surface of the wafer; and testing the wafer by using a testing device.

One of features of this application is to provide a new wafer detection process to resolve a problem that a warped wafer is difficult to detect.

DETAILED DESCRIPTION

Figure 1:
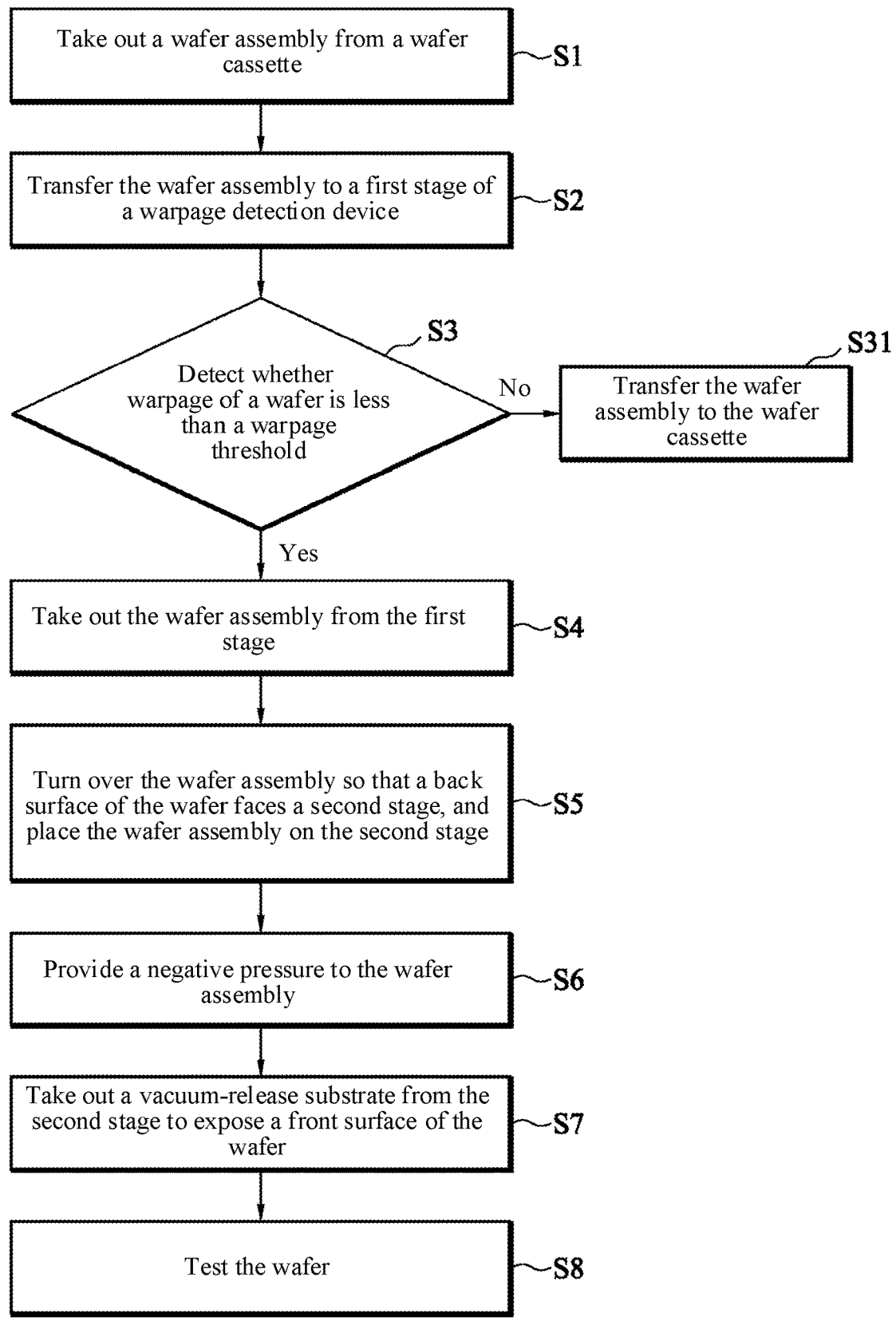
FIG. 1 is an example flowchart of a wafer testing method of the present invention.

In the specification and the scope of the patent application, "up" or "down" is only used to illustrate an orientation shown in the drawings, instead of limiting an actual orientation. The term "front surface" of a wafer is a main processing surface of a semiconductor process, that is, a surface on which a plurality of semiconductor devices are formed. The term "back surface" of the wafer is relative to the "front surface" of the wafer, and is generally a smooth surface, but a back surface of each of some wafers is a conductive plane, such as a VCSEL wafer.

A relative size and a thickness of each element in the drawings are only an example, and do not limit an actual relative size relationship of each element.

Figure 2A:
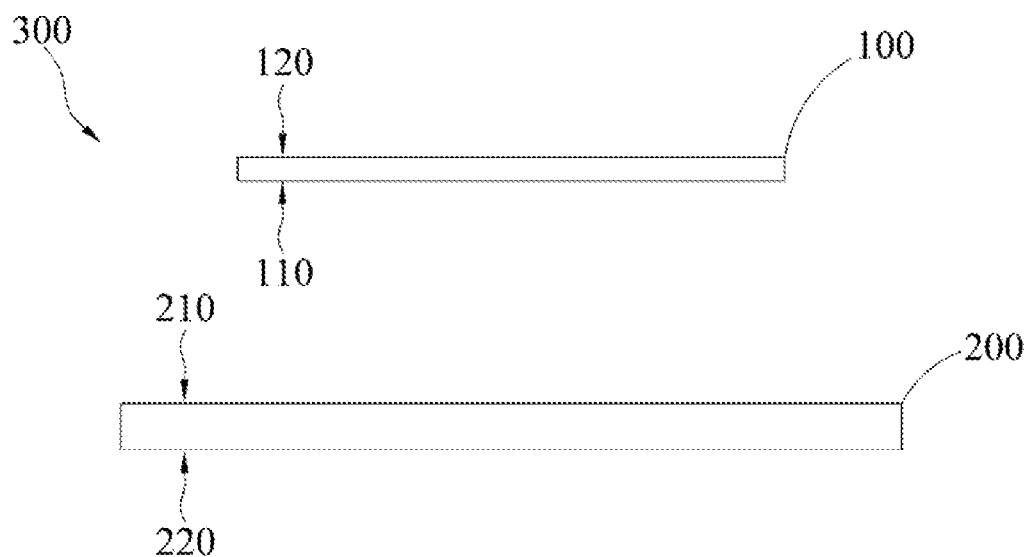
FIG. 2A is an exploded schematic diagram of a wafer assembly.
Figure 2B:
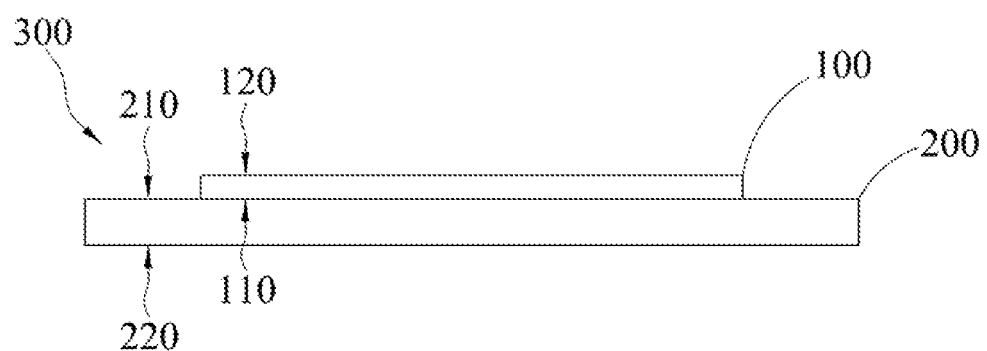
FIG. 2B is a schematic assembly diagram of a wafer assembly.

FIG. 1, FIG. 2A, and FIG. 2B are respectively an example flowchart of a wafer testing method of the present invention and an exploded schematic diagram and a schematic assembly diagram of a wafer assembly. The wafer testing method of the present invention is adapted to test a wafer 100, especially for testing the wafer 100 with a thickness of less than 200 microns. The wafer 100 is disposed on a vacuum-release substrate 200 and is combined with the vacuum-release substrate 200 to form a wafer assembly 300. The vacuum-release substrate 200 has an attaching surface 210 and a non-attaching surface 220 opposite to the attaching surface 210, the attaching surface 210 of the vacuum-release substrate 200 is attached to a front surface 110 of the wafer 100 with an attaching force.

The vacuum-release substrate 200 is a substrate widely used by semiconductor manufacturers, and a characteristic of the vacuum-release substrate is that the attaching force provided by the vacuum-release substrate is sensitive to an air pressure. When a pressure difference between the non-attaching surface 220 of the vacuum-release substrate 200 and the attaching surface 210 is zero or less than a predetermined value, the attaching surface 210 of the vacuum-release substrate 200 can provide the attaching force to the front surface 110 of the wafer 100. When the pressure difference between the non-attaching surface 220 of the vacuum-release substrate 200 and the attaching surface 210 is greater than the predetermined value, the attaching force provided by the attaching surface 210 of the vacuum-release substrate 200 for the front surface 110 of the wafer 100 greatly decreases, so that the vacuum-release substrate 200 can be separated from the wafer 100. Hereinafter, the wafer testing method of the present invention is described with reference to the drawings.

When a wafer test production line receives a to-be-tested wafer product, the to-be-tested wafer product is usually stored in a wafer cassette. Therefore, during wafer testing, an operator needs to first take out the to-be-tested wafer product (the wafer assembly 300) stored in the wafer cassette and place the to-be-tested wafer product on a testing machine for testing. Generally, each wafer cassette stores more than one wafer assembly 300, and usually stores 25 wafer assemblies 300.

Figure 3A:
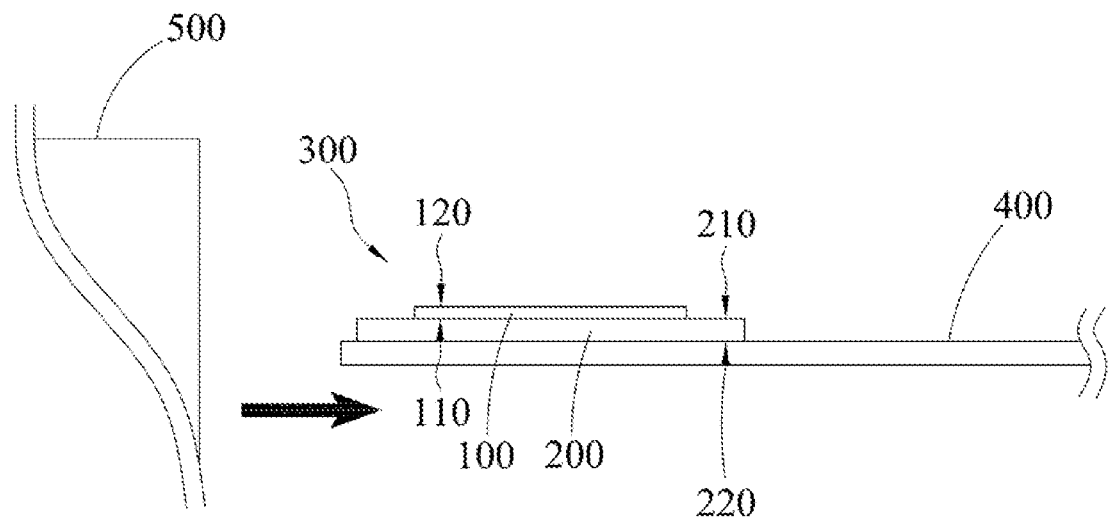
FIG. 3A is a schematic operation diagram (1) of a wafer testing method of the present invention.
Figure 3B:
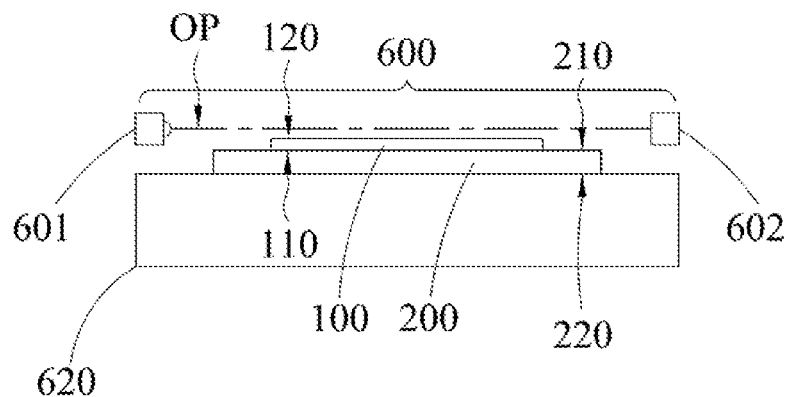
FIG. 3B is a schematic operation diagram (2) of a wafer testing method of the present invention.
Figure 3C:
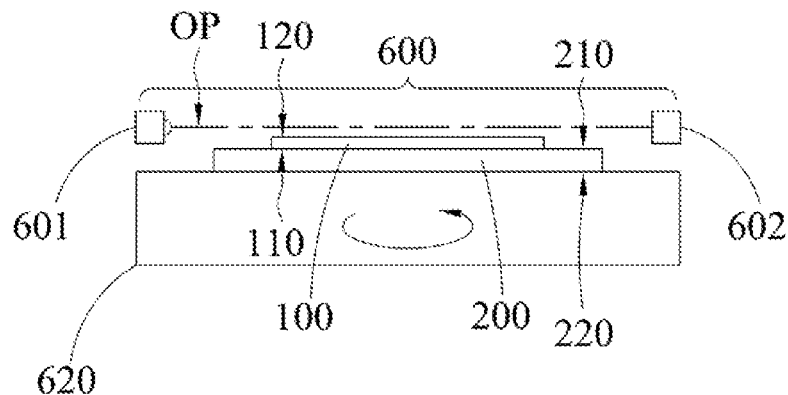
FIG. 3C is a schematic operation diagram (3) of a wafer testing method of the present invention.

As shown in FIG. 3A, during wafer testing, first, the wafer assembly 300 is taken out from a wafer cassette 500 through a robotic arm 400 (step S1). Then, as shown in FIG. 3B, the wafer assembly 300 is transferred to a warpage detection device 600, and the wafer assembly 300 is placed on a first stage 620 (step S2). In this embodiment, the non-attaching surface 220 of the vacuum-release substrate 200 is placed on the first stage 620. Then, as shown in FIG. 3C, it is detected, by using the warpage detection device 600, whether warpage of the wafer 100 is less than a warpage threshold (step S3). In some embodiments, the warpage detection device 600 is a camera module, and a warpage degree of the wafer is determined through image recognition. In some embodiments, the warpage detection device 600 is a light blocking sensing device shown in FIG. 3B and includes a light transmitter 601 and a light receiver 602. The optical transmitter 601 and the optical receiver 602 are respectively located on two opposite sides of the first stage 620, and an optical path OP is defined between the optical transmitter 601 and the optical receiver 602, where a light (for example, an infrared ray) emitted by the optical transmitter 601 travels along the optical path OP and then reaches the optical receiver 602. A vertical distance between the optical path OP and a back surface 120 of the wafer 100 is preset. During warpage testing, the first stage 620 rotates and drives the wafer assembly 300 thereon to rotate together. If the optical path OP is blocked by the wafer 100 during the rotation, it is determined that the warpage of the wafer 100 is greater than the warpage threshold. In this case, the robotic arm 400 transfers the wafer assembly 300 to the wafer cassette 500 without detection, to avoid subsequent wafer breakage (step S31).

Figure 3D:
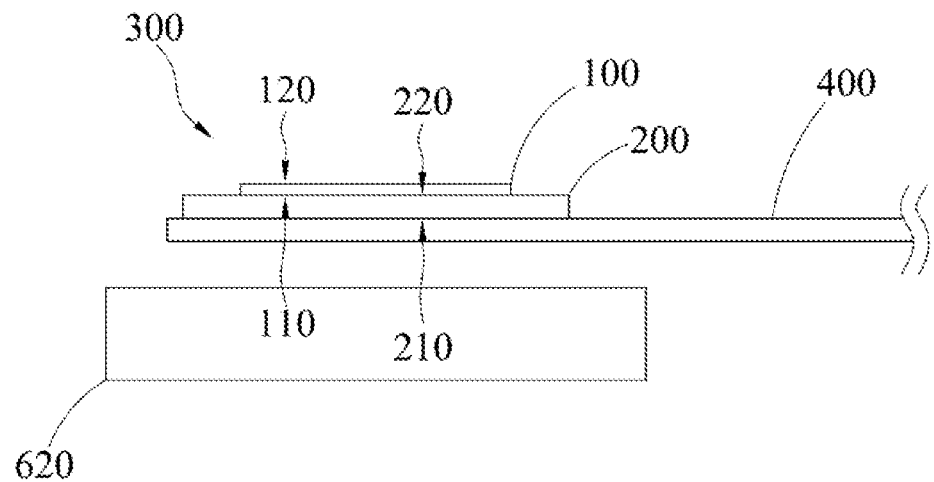
FIG. 3D is a schematic operation diagram (4) of a wafer testing method of the present invention.
Figure 3E:
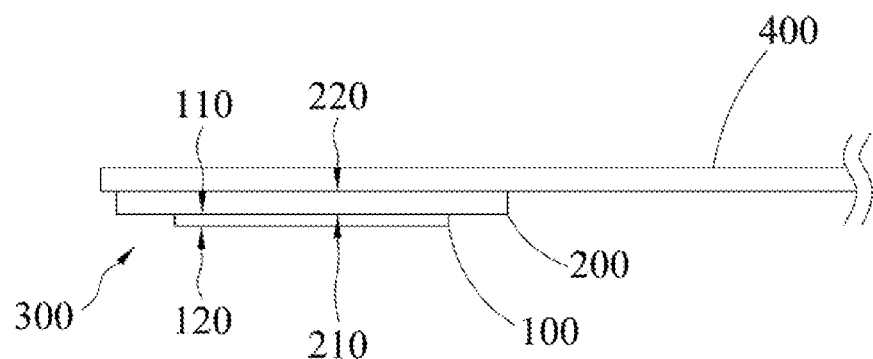
FIG. 3E is a schematic operation diagram (5) of a wafer testing method of the present invention.
Figure 3F:
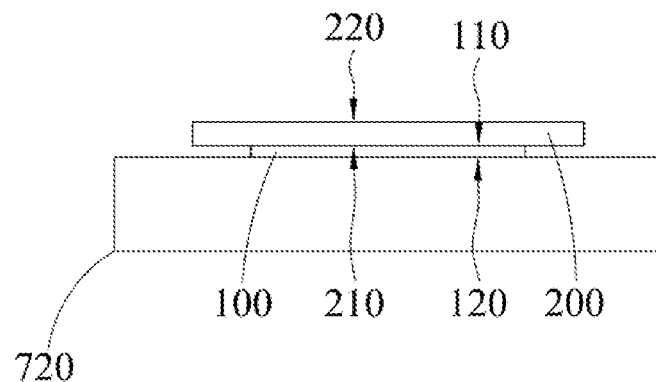
FIG. 3F is a schematic operation diagram (6) of a wafer testing method of the present invention.

Based on the above, as shown in FIG. 3D, if the optical path OP is not blocked by the wafer 100 during the rotation of the first stage 620, it is determined that the warpage of the wafer 100 is less than the warpage threshold. In this case, the robotic arm 400 takes out the wafer assembly 300 from the first stage 620 (step S4). Next, as shown in FIG. 3E, the robotic arm 400 turns over the wafer assembly 300 by 180 degrees (step S5). After being turned over, the back surface 120 of the wafer 100 faces a second stage 720. Then, as shown in FIG. 3F, the robotic arm 400 places the wafer assembly 300 on the second stage 720 (step S5). In this case, the back surface 120 of the wafer 100 faces the second stage 720 and is in contact with a surface of the second stage 720.

Figure 3G:
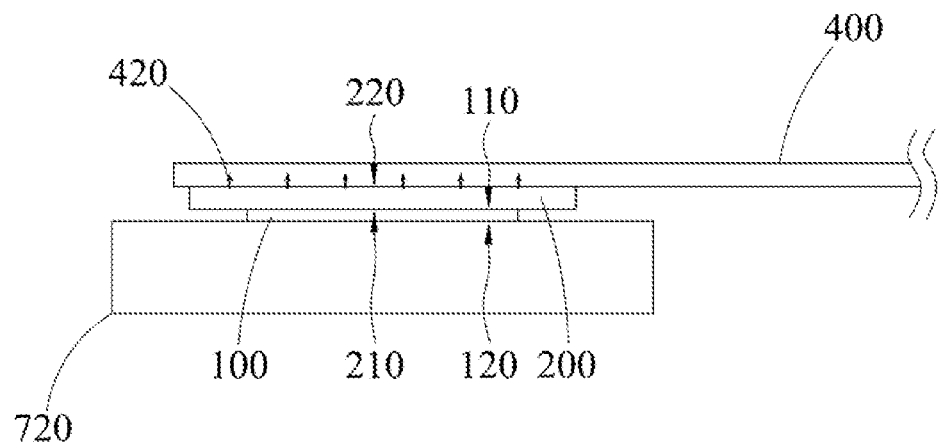
FIG. 3G is a schematic operation diagram (7) of a wafer testing method of the present invention.
Figure 3H:
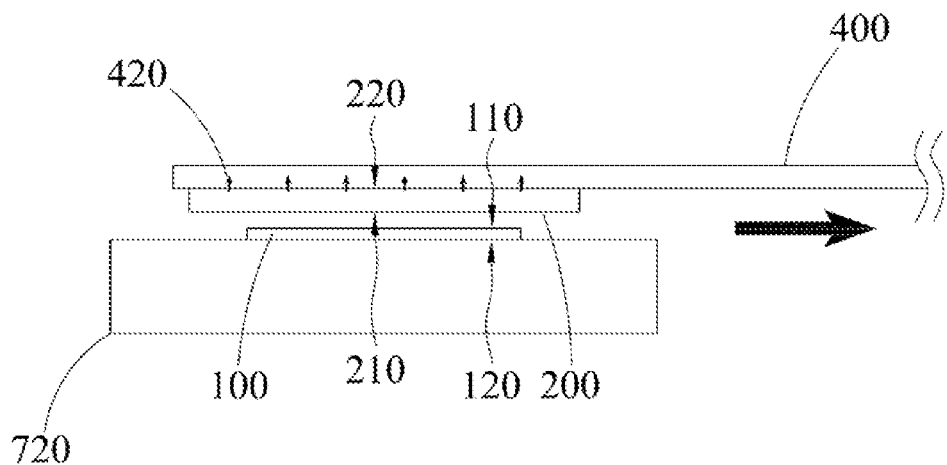
FIG. 3H is a schematic operation diagram (8) of a wafer testing method of the present invention.
Figure 3I:
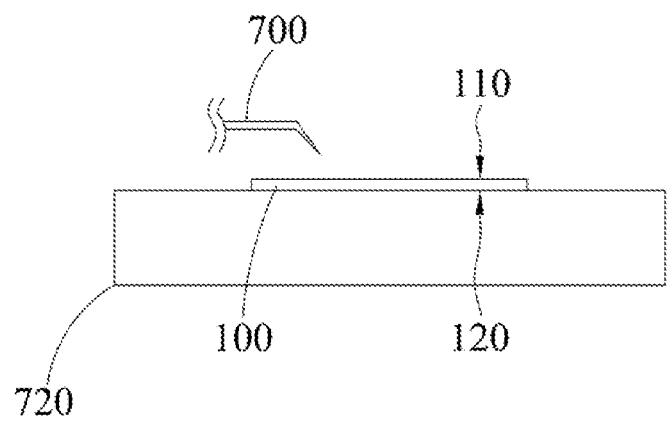
FIG. 3I is a schematic operation diagram (9) of a wafer testing method of the present invention.

At this point, the front surface 110 of the wafer 100 is still covered by the vacuum-release substrate 200, and therefore the vacuum-release substrate 200 needs to be removed later to test the wafer 100. As shown in FIG. 3G, the attaching force applied by the vacuum-release substrate 200 to the wafer 100 is sensitive to the air pressure. Therefore, as long as the robotic arm 400 provides a negative pressure 420 to the vacuum-release substrate 200 of the wafer assembly 300, the attaching force between the vacuum-release substrate 200 and the wafer 100 can be eliminated or greatly reduced (step S6). Then, as shown in FIG. 3H, after eliminating the attaching force between the vacuum-release substrate 200 and the wafer 100, the front surface 110 of the wafer 100 can be exposed as long as the vacuum-release substrate 200 is taken out through the robotic arm 400 (step S7). Finally, as shown in FIG. 3I, a die on the wafer 100 is tested by using a testing device 700 (step S8). It should be particularly noted herein that after the vacuum-release substrate 200 is removed, the wafer 100 may return to a warped state. Therefore, in some embodiments, the surface of the second stage 720 is provided with a plurality of flow channels or micropores, each flow channel or micropore is connected to a vacuum pump through a pipeline, and the vacuum pump is used to apply vacuum suction to the back surface 120 of the wafer 100, so that after the vacuum-release substrate 200 is separated from the wafer 100, the wafer 100 can remain flat. It should be particularly noted herein that a time point when the second stage 720 provides vacuum suction to the back surface 120 of the wafer 100 is not particularly limited. For example, the vacuum suction may be provided as soon as the wafer assembly 300 is placed on the second stage 720 (the vacuum suction is provided immediately after step S5 is completed), or may be provided during the providing of the negative pressure 420 (the vacuum suction is provided during step S6), or may be provided after the vacuum-release substrate 200 is removed (the vacuum suction is provided after step S7 is completed).

In some embodiments, when the wafer assembly 300 is placed on the first stage 620, a pressure when the wafer assembly 300 is in contact with the first stage 620 is controlled to be less than a pressure threshold through a pressure sensor disposed on the first stage 620 or on the robotic arm 400, to prevent a damage to the wafer 100 during the placement.

Figure 3J:
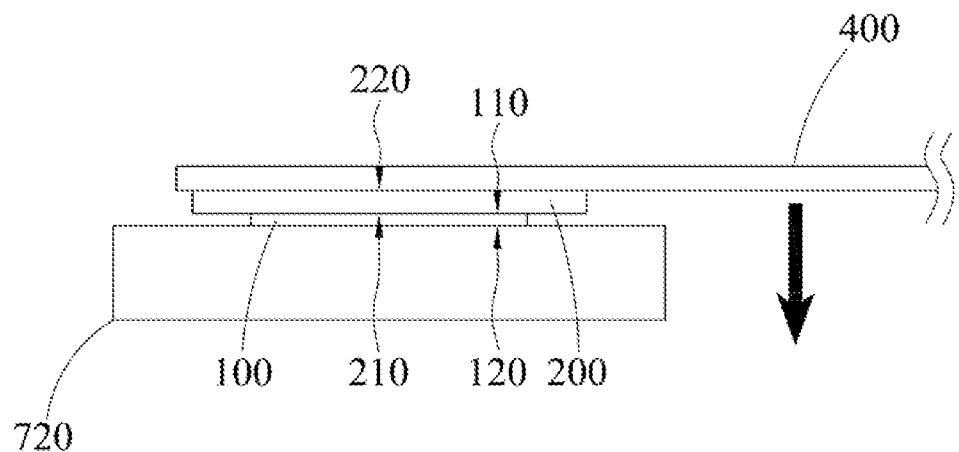
FIG. 3J is a schematic operation diagram (10) of a wafer testing method of the present invention.
Figure 3K:
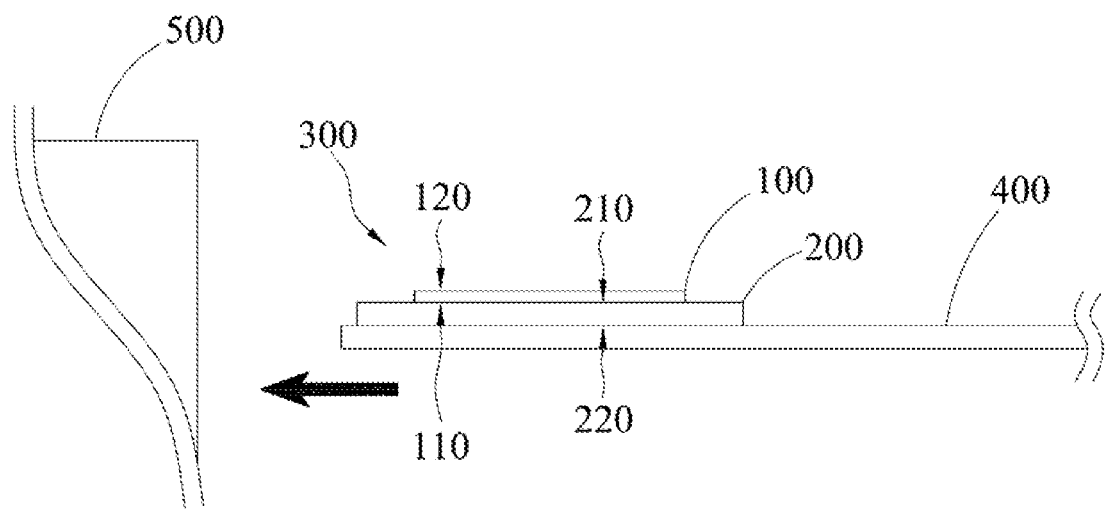
FIG. 3K is a schematic operation diagram (11) of a wafer testing method of the present invention.

In some embodiments, after the wafer 100 is tested, the wafer 100 usually needs to be further recombined with the vacuum-release substrate 200 to prevent the wafer 100 from being damaged during transportation. In this case, as shown in FIG. 3J, the vacuum-release substrate 200 is placed on the front surface 110 of the wafer 100 through the robotic arm 400, where the attaching surface 210 of the vacuum-release substrate 200 faces the front surface 110 of the wafer 100. In addition, the robotic arm 400 vertically applies a positive pressure to the non-attaching surface 220 of the vacuum-release substrate 200 for about 1 to 3 seconds (or for a period of time), so that the attaching surface 210 of the vacuum-release substrate 200 is in close contact with the front surface 110 of the wafer 100. Subsequently, as shown in FIG. 3K, the robotic arm 400 can turn over the wafer assembly 300 again by 180 degrees, and then transfer the wafer assembly 300 back to the original wafer cassette 500, or transfer the wafer assembly to another wafer cassette for storing the wafer assembly 300 that has just been tested. Next, the above steps S1 to S8 may be performed on another wafer assembly, so that all wafer assemblies in the wafer cassette can be tested repeatedly.

In the above embodiment, the reason why the vacuum-release substrate 200 needs to be attached to the front surface 110 of the wafer 100 is that a front surface of each of some to-be-tested wafer (for example, a VCSEL wafer) includes a light-emitting surface of each VCSEL die and a to-be-tested contact point, and a back surface is a conductive plane. When testing such wafers, the back surface of the to-be-tested wafer needs to be electrically connected to a surface of a stage on which the to-be-tested wafer is placed. Therefore, the back surface 120 of the wafer 100 can face the second stage 720 only when the vacuum-release substrate 200 is attached to the front surface 110 of the wafer 100 and the wafer assembly 300 is subsequently transferred to the second stage 720. However, even if the back surface of the to-be-tested wafer is not a conductive plane, the wafer testing method disclosed in the above embodiments can also be applied.

It should be noted herein that the positive pressure applied by the robotic arm 400 to the vacuum-release substrate 200 needs to be controlled between an upper limit value and a lower limit value. If the applied force is too large, the wafer 100 is damaged. If the applied force is too small, the attaching surface 210 of the vacuum-release substrate 200 may not be completely attached to the front surface 110 of the wafer 100. In this case, the attaching force applied to the wafer 100 may be insufficient, and consequently, the wafer 100 and the vacuum-release substrate 200 are to be separated during subsequent processing or transportation.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A wafer testing method adapted to test a wafer, the wafer being disposed on a vacuum-release substrate and being combined with the vacuum-release substrate to form a wafer assembly, wherein the vacuum-release substrate has an attaching surface and a non-attaching surface opposite to the attaching surface, the attaching surface of the vacuum-release substrate is configured to provide an attaching force to a front surface of the wafer so as to be attached to the front surface of the wafer when a pressure difference between the non-attaching surface and the attaching surface is less than a predetermined value, the wafer assembly is placed in a wafer cassette, and the wafer testing method comprises:
taking out the wafer assembly from the wafer cassette with a robotic arm;
transferring the wafer assembly to a warpage detection device with the robotic arm, and placing the wafer assembly on a first stage of the warpage detection device;
detecting whether warpage of the wafer is less than a warpage threshold by using the warpage detection device;
if the warpage of the wafer is less than the warpage threshold, taking out the wafer assembly from the first stage with the robotic arm;
turning over the wafer assembly by 180 degrees with the robotic arm, and placing the wafer assembly on a second stage;
providing a negative pressure to the wafer assembly to eliminate the attaching force between the vacuum-release substrate and the wafer;
taking out the vacuum-release substrate from the second stage with the robotic arm to expose the front surface of the wafer; and
testing the wafer.

2. The wafer testing method according to claim 1, wherein the step of placing the wafer assembly on a first stage further comprises:
controlling a pressure of the wafer assembly in contact with the first stage to be less than a pressure threshold.

3. The wafer testing method according to claim 1, wherein after testing the wafer, the method further comprises:
placing the vacuum-release substrate on the wafer, wherein the attaching surface of the vacuum-release substrate faces the front surface of the wafer;
applying a positive pressure to the non-attaching surface of the vacuum-release substrate so that the attaching surface of the vacuum-release substrate is attached to the front surface of the wafer to form the wafer assembly; and
taking out the wafer assembly from the second stage with the robotic arm.

4. The wafer testing method according to claim 3, wherein the step of applying a positive pressure to the non-attaching surface of the vacuum-release substrate further comprises:
controlling the positive pressure between an upper limit value and a lower limit value.

5. The wafer testing method according to claim 4, wherein after taking out the wafer assembly from the second stage, the method further comprises:
turning over the wafer assembly by 180 degrees with the robotic arm, and transferring the wafer assembly to the wafer cassette.

6. The wafer testing method according to claim 1, wherein the warpage detection device is a light blocking sensing device.

7. The wafer testing method according to claim 6, wherein the step of detecting the warpage of the wafer comprises:
disposing an optical transmitter and an optical receiver of the light blocking sensing device on two opposite sides of the first stage, and defining an optical path between the optical transmitter and the optical receiver; and
rotating the first stage, and if the optical path is not blocked by the wafer during the rotation of the first stage, determining that the warpage of the wafer is less than the warpage threshold.

8. The wafer testing method according to claim 1, wherein if the warpage of the wafer is greater than the warpage threshold, the robotic arm takes out the wafer assembly from the first stage and transfers the wafer assembly to the wafer cassette.

9. The wafer testing method according to claim 1, wherein the step of placing the wafer assembly on a first stage of the warpage detection device further comprises:
placing the non-attaching surface of the vacuum-release substrate on the first stage.

10. The wafer testing method according to claim 1, wherein the step of placing the wafer assembly on a second stage further comprises:

enabling a back surface of the wafer to face the second stage and to be in contact with a surface of the second stage.

* * * * *